US011356022B2

(12) United States Patent
Chen

(10) Patent No.: US 11,356,022 B2
(45) Date of Patent: Jun. 7, 2022

(54) INDUCTOR CURRENT DETECTING CIRCUIT

(71) Applicant: ANPEC ELECTRONICS CORPORATION, Hsinchu (TW)

(72) Inventor: Chih-Yuan Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 169 days.

(21) Appl. No.: 16/940,455

(22) Filed: Jul. 28, 2020

(65) Prior Publication Data

US 2021/0367505 A1    Nov. 25, 2021

(30) Foreign Application Priority Data

May 22, 2020    (TW) ................................ 109117052

(51) Int. Cl.
*H02M 3/158* (2006.01)
*H02M 1/32* (2007.01)
*H02M 1/08* (2006.01)
*G01R 19/00* (2006.01)
*H02M 1/00* (2006.01)

(52) U.S. Cl.
CPC ...... *H02M 3/1582* (2013.01); *G01R 19/0092* (2013.01); *H02M 1/0009* (2021.05); *H02M 1/083* (2013.01); *H02M 1/32* (2013.01)

(58) Field of Classification Search
CPC ...... H02M 1/0009; H02M 1/083; H02M 1/32; H02M 3/1582
See application file for complete search history.

(56) References Cited

U.S. PATENT DOCUMENTS

| 10,312,806 B1* | 6/2019 | Chen ..................... H02M 3/158 |
| 10,833,661 B1* | 11/2020 | Archibald ............... H03K 4/08 |
| 2018/0248481 A1* | 8/2018 | Couleur .............. H02M 3/1584 |
| 2020/0292380 A1* | 9/2020 | Chen .......................... G01J 1/46 |

* cited by examiner

Primary Examiner — Rafael O De Leon Domenech
(74) Attorney, Agent, or Firm — Li & Cai Intellectual Property (USA) Office

(57) ABSTRACT

An inductor current detecting circuit is provided. A current supplying circuit supplies a first current signal to an energy storage circuit having a zero voltage during a high-side conduction time, and a second current signal to the energy storage circuit having the zero voltage during a low-side conduction time. A voltage comparator circuit subtracts a valley voltage of a low-side switch from a peak voltage of a high-side switch to obtain a reference voltage, and outputs a comparison signal according to a voltage of the energy storage circuit and a reference voltage. A current modulation controller circuit modulates currents of the first and second current signals according to the comparison signal. A synthesizing circuit synthesizes the first and the second current signals, each of which charges the voltage of the energy storage circuit to be equal to the reference voltage from zero, to obtain an inductor current signal.

10 Claims, 7 Drawing Sheets

INDUCTOR CURRENT DETECTING CIRCUIT

CROSS-REFERENCE TO RELATED PATENT APPLICATION

This application claims the benefit of priority to Taiwan Patent Application No. 109117052, filed on May 22, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an inductor current detecting current, and more particularly to an inductor current detecting current for a power converter.

BACKGROUND OF THE DISCLOSURE

A power converter is essential for voltage adjustment and stabilization of an electronic device. Based upon different power requirements, various types of DC-DC voltage converters such as a buck converter and a boost converter have been developed. The buck converter can decrease an input DC voltage to a default voltage, and the boost converter can increase an input DC voltage. With advances in circuit technologies, both the buck and boost converters have been adjusted for different system architectures and requirements.

If a conventional power converter operates in a current controlling mode, a current value of an inductor of the conventional power converter needs to be detected. A high-side switch and a low-side switch of the conventional power converter are turned on or off according to the detected current value. In order to obtain the current value of the inductor, a resistor is additionally disposed in the conventional power converter and connected in series with the inductor. The current value of the inductor is equal to a current value of the resistor. Therefore, the conventional power converter obtains the current value of the inductor by detecting the current value of the resistor. However, the resistor not only occupies a space inside the conventional power converter, but also increases additional power consumption. In recent years, in order to meet low power consumption requirements, the resistor must have a small resistance. Under this condition, the current value of the resistor cannot be detected accurately. As a result, the high-side switch and the low-side switch cannot be accurately turned on or off. Therefore, the conventional power converter cannot achieve a fast response effect.

SUMMARY OF THE DISCLOSURE

In response to the above-referenced technical inadequacies, the present disclosure provides an inductor current detecting circuit for a power converter. The power converter includes an output inductor, an output capacitor, a high-side switch, a low-side switch, a comparator, a control circuit and a voltage divider circuit. One terminal of the output inductor is connected to a node between the high-side switch and the low-side switch. The other terminal of the output inductor is grounded through the output capacitor. The voltage divider circuit is connected to an output node between the output inductor and the output capacitor and divides an output voltage of the output node to output a feedback voltage. The comparator compares the feedback voltage with a reference voltage to output a voltage comparison signal. The control circuit turns on or off the high-side switch and the low-side switch according to the voltage comparison signal. The inductor current detecting circuit includes a charging current circuit and a synthesizing circuit. The charging current circuit includes an energy storage circuit, a current supplying circuit, a voltage comparator circuit and a current modulation controller circuit. The current supplying circuit is connected to the energy storage circuit. The current supplying circuit is configured to supply a first current signal to the energy storage circuit during a high-side conduction time and supply a second current signal to the energy storage circuit during a low-side conduction time. The voltage comparator circuit is connected to the energy storage circuit. The voltage comparator circuit is configured to obtain a reference voltage calculated by subtracting a valley voltage of the low-side switch from a peak voltage of the high-side switch and output a comparison signal according to a voltage of the energy storage circuit and the reference voltage. The current modulation controller circuit is connected to the voltage comparator circuit and the current supplying circuit. The current modulation controller circuit is configured to modulate currents of the first current signal and the second current signal to be supplied by the current supplying circuit according to the comparison signal. The synthesizing circuit is connected to the current supplying circuit. The synthesizing circuit is configured to synthesize the first current signal with the second current signal to obtain an inductor current signal, wherein each of the first current signal and the second current signal charges the voltage of the energy storage circuit to be equal to the reference voltage from zero.

In certain embodiments, the current supplying circuit includes a current source.

In certain embodiments, the voltage comparator circuit includes a comparator, an operational amplifier or an error amplifier.

In certain embodiments, the energy storage circuit includes a capacitor. A first terminal of the capacitor is connected to the voltage comparator circuit, and a second terminal of the capacitor is grounded.

In certain embodiments, the inductor current detecting circuit includes a switch component connected between the energy storage circuit and the voltage comparator circuit. The voltage comparator circuit is configured to sample the voltage of the energy storage circuit when the switch component is turned on.

In certain embodiments, the control circuit turns on the high-side switch during a working period of a high-side conduction signal. The switch component is turned on at a time point of a falling edge of a waveform of the high-side conduction signal.

In certain embodiments, the control circuit turns on the low-side switch during a working period of a low-side conduction signal. The switch component is turned on at a time point of a falling edge of a waveform of the low-side conduction signal.

In certain embodiments, the inductor current detecting circuit includes two charging current circuits, one of the charging current circuits is configured to supply and modulate the first current signal, and the other of the charging current circuits is configured to supply and modulate the second current signal.

In certain embodiments, the synthesizing circuit includes a capacitor, a first current source, a first switch component, a second switch component and a second current source. The first current source is connected to the current supplying circuit. The first current source is configured to supply a high-side charging current signal. A current of the high-side charging current signal is equal to the current of the first current signal that charges the voltage of the energy storage circuit to be equal to the reference voltage from zero. A first terminal of the first switch component is connected to the first current source. A second terminal of the first switch component is connected to a first terminal of the capacitor. A second terminal of the capacitor is grounded. A first terminal of the second switch component is connected to the second terminal of the first switch component. The second current source is connected to the current supplying circuit, a second terminal of the second switch component and the second terminal of the capacitor. The second current source is configured to supply a low-side charging current signal. A current of the low-side charging current signal is equal to the current of the second current signal that charges the voltage of the storage circuit to be equal to the reference voltage from zero. When the first switch component is turned on and the second switch component is turned off, the high-side charging current signal flows to the capacitor such that the capacitor generates a charging current signal. When the second switch component is turned on and the first switch component is turned off, the low-side charging current signal flows to the capacitor such that the capacitor generates a discharging current signal, which is synthesized with the charging current signal to form an inductor current signal.

In certain embodiments, the current modulation controller circuit includes a continuous progressive logic circuit.

As described above, the present disclosure provides the inductor current detecting circuit for the power converter, in which an additional component such as a resistor that causes unnecessary power consumption is not disposed. The inductor current detecting circuit of the present disclosure can detect a complete waveform of the inductor current signal of the power converter. When the power converter such as a buck converter is operated in a current controlling mode, the high-side switch and the low-side switch are controlled according to the complete waveform of the detected inductor current signal. Therefore, the power converter can achieve a fast response effect.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
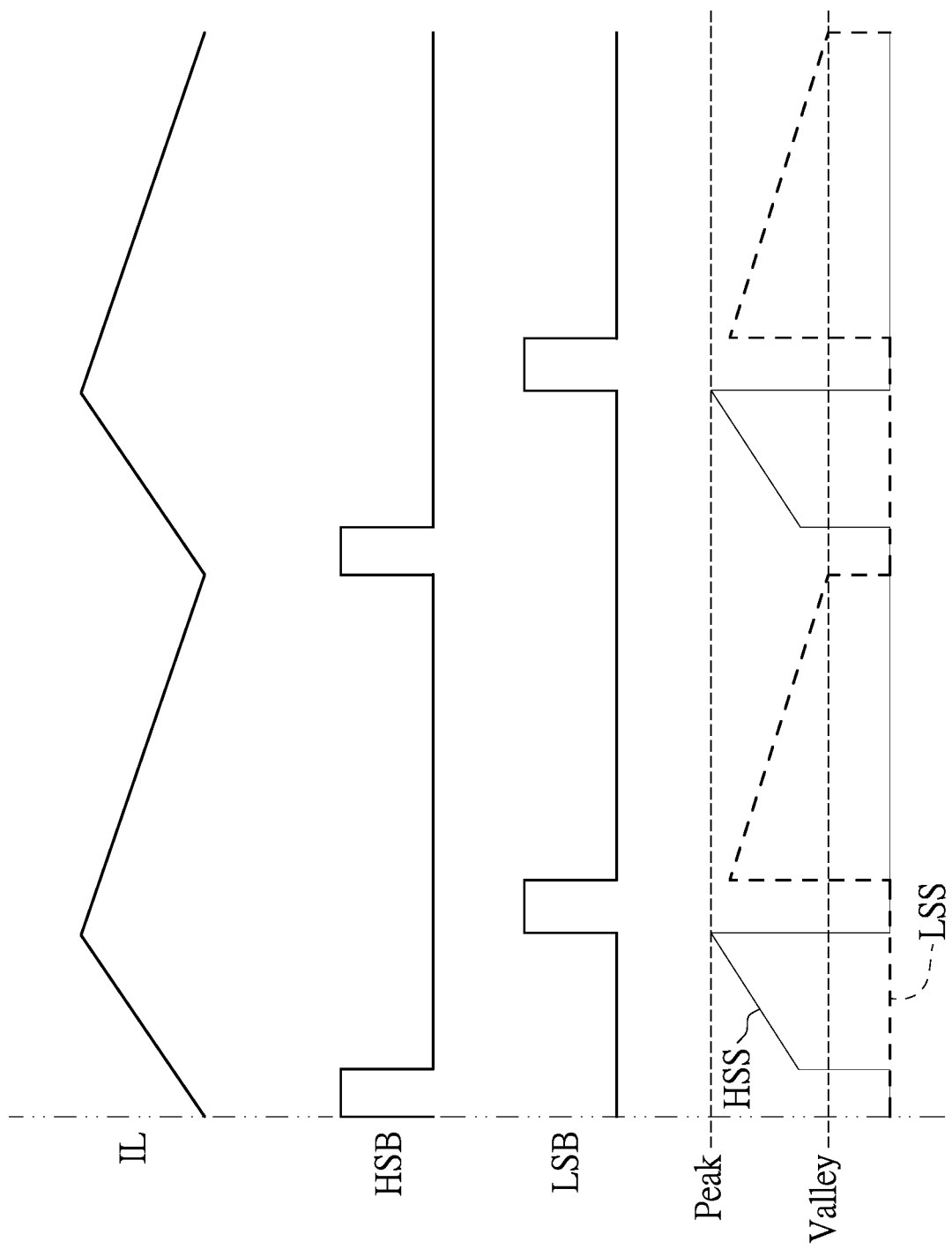
FIG. 1 is a waveform diagram of signals of a power converter.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a waveform diagram of signals of a power converter.

It should be understood by those skilled in the art that, the power converter basically includes an output inductor, an output capacitor, a high-side switch, a low-side switch, a comparator, a control circuit, and a voltage divider circuit. One terminal of the output inductor of the power converter is connected to a node between the high-side switch and the low-side switch. The other terminal of the output inductor is grounded through the output capacitor. The voltage divider circuit is connected to an output node (that is an output terminal of the power converter) between the output inductor and the output capacitor, and divides an output voltage of the output node to output a feedback voltage. The comparator compares the feedback voltage with a reference voltage to output a voltage comparison signal. The control circuit turns on or off the high-side switch and the low-side switch according to the voltage comparison signal.

For convenience of explanation, only basic circuit architecture of the power converter is mentioned herein, but in practice, other circuit components may be additionally disposed in the power converter, and configurations of the circuit components may be determined according to actual requirements.

A purpose of the present disclosure is to accurately obtain a current of an inductor of the power converter such as an inductor current IL shown in FIG. 1, and accordingly control the high-side switch and the low-side switch of the power converter such that the power converter achieves a fast response effect.

In order to obtain the inductor current IL, when the high-side switch and the low-side switch such as metal oxide semiconductor field effect transistors (MOSFETs) are turned on, a resistance (Rds-on) between a drain and a source of the high-side switch and a resistance (Rds-on) between a drain and a source of the low-side switch need to be detected. However, when the metal oxide semiconductor field effect transistors are turned on such that noise is generated, the resistances cannot be detected. For example, the resistances (Rds-on) of the high-side switch and the low-side switch cannot be detected, during a working period of a blank signal HSB of the high-side switch and a working period of a blank signal LSB of the low-side switch as shown in FIG. 1.

Figure 4:
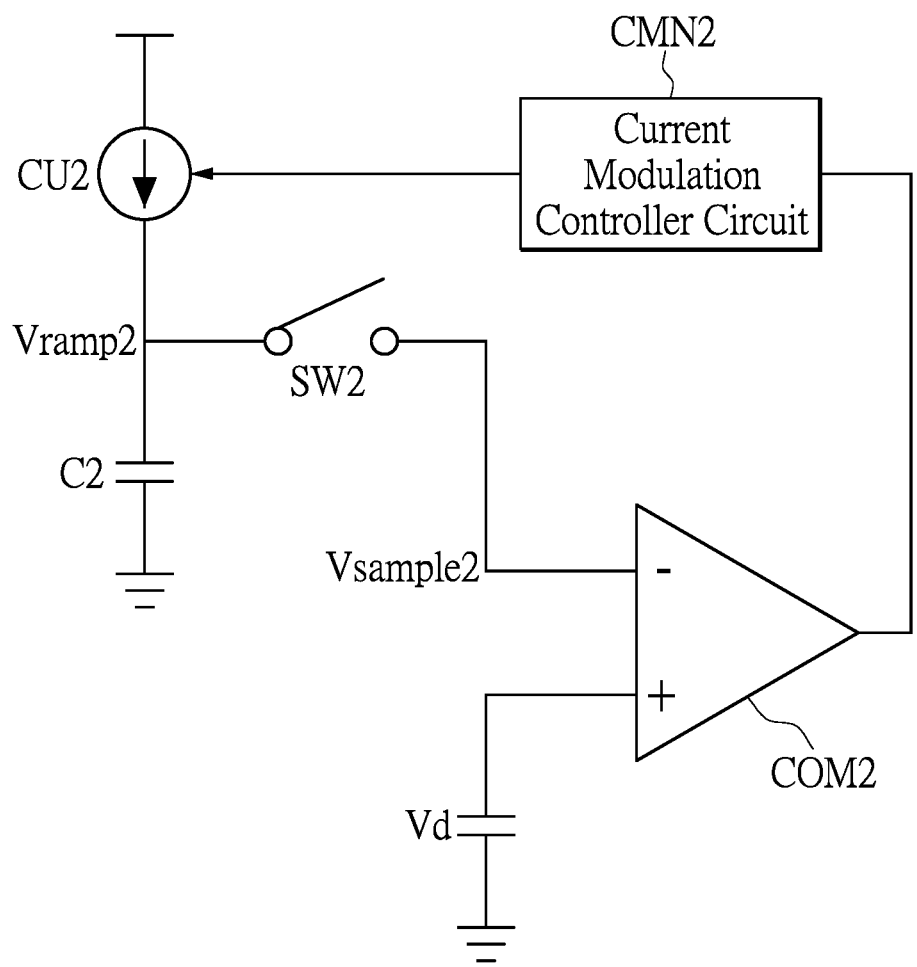
FIG. 4 is a circuit diagram of a second charging current circuit of the inductor current detecting circuit according to the embodiment of the present disclosure.
Figure 6:
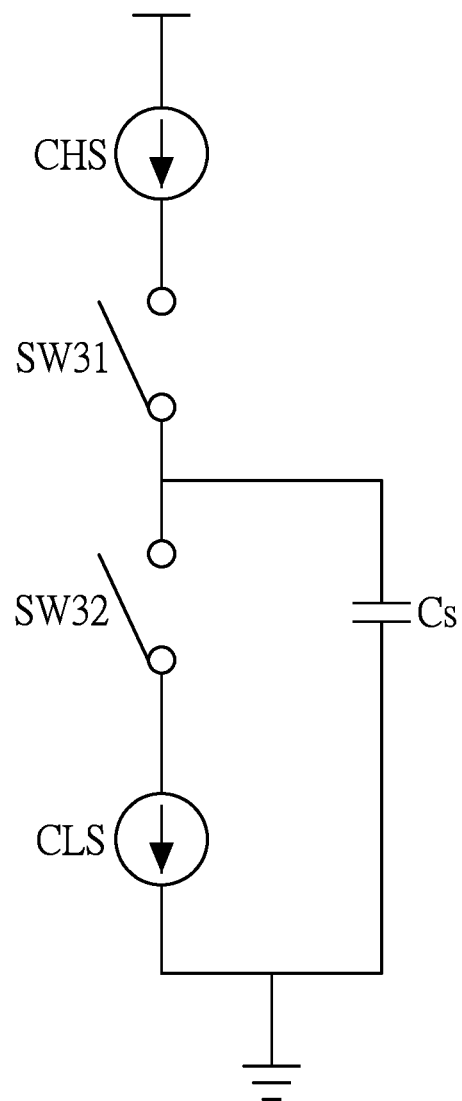
FIG. 6 is a circuit diagram of a synthesizing circuit of the inductor current detecting circuit according to the embodiment of the present disclosure.

As a result, a voltage signal HSS and a voltage signal LSS are discontinuous signals such that the inductor current IL obtained by a system has incomplete waveforms. In order to obtain the inductor current IL that has continuous and complete waveforms, the present disclosure provides an inductor current detecting circuit as shown in FIGS. 2, 4 and 6, which are specifically described in the following.

Figure 2:
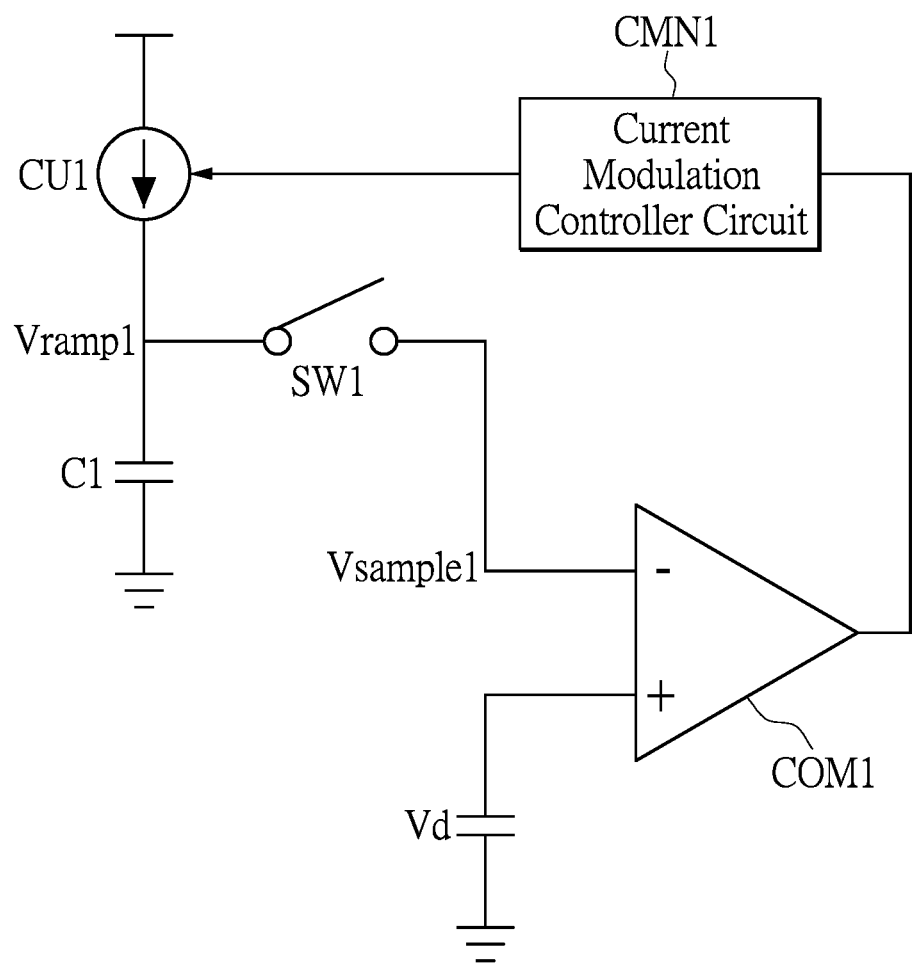
FIG. 2 is a circuit diagram of a first charging current circuit of an inductor current detecting circuit according to an embodiment of the present disclosure.
Figure 3:
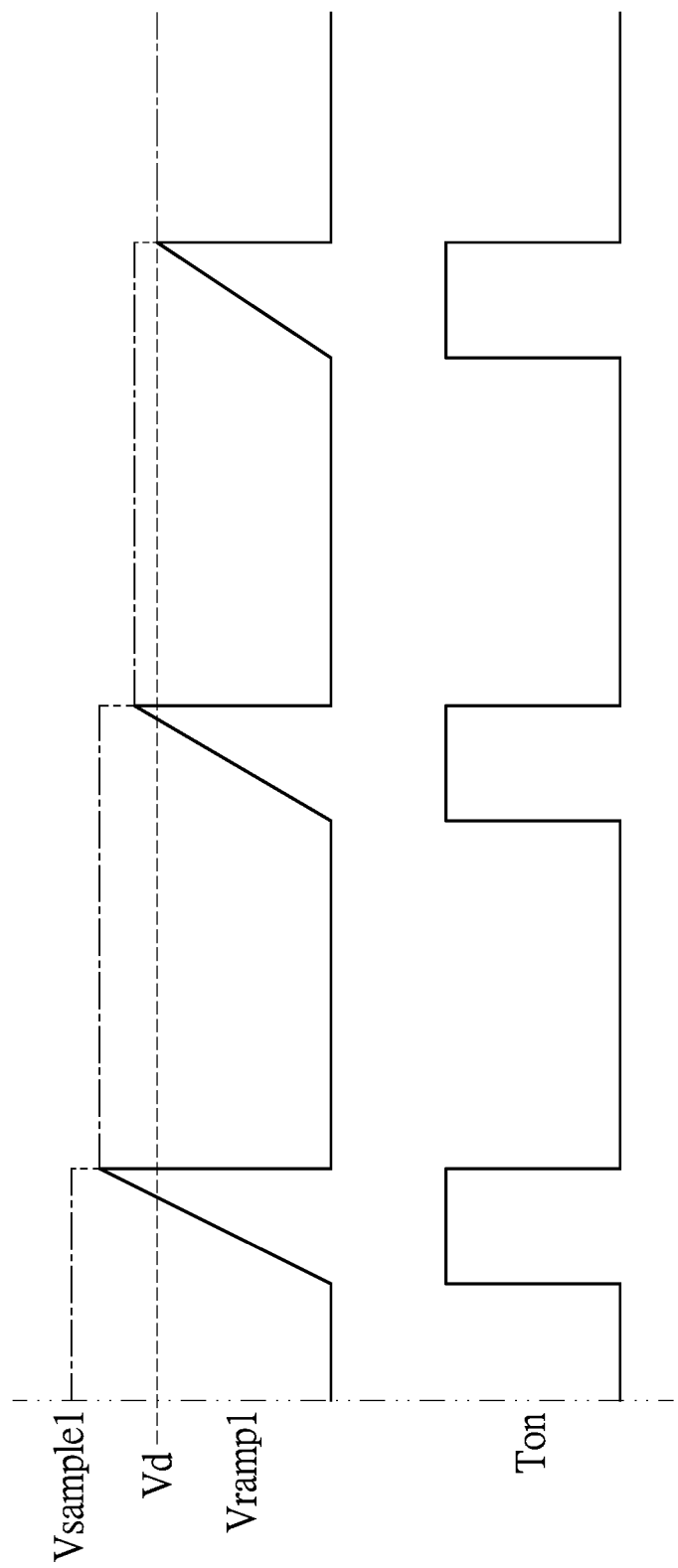
FIG. 3 is a waveform diagram of signals of the first charging current circuit of the inductor current detecting circuit according to the embodiment of the present disclosure.

Reference is made to FIGS. 2 and 3, wherein FIG. 2 is a circuit diagram of a first charging current circuit of the inductor current detecting circuit according to an embodiment of the present disclosure, and FIG. 3 is a waveform diagram of signals of the first charging current circuit of the inductor current detecting circuit according to the embodiment of the present disclosure.

In the embodiment, the inductor current detecting circuit may include the first charging current circuit shown in FIG. 2. The first charging current circuit may include a storage circuit such as a capacitor C1 shown in FIG. 2, a current supplying circuit such as a variable current source CU1 shown in FIG. 2, a voltage comparator circuit such as a comparator COM1 shown in FIG. 2, an operational amplifier or an error amplifier, and a current modulation controller circuit CMN1 shown in FIG. 2 such as a successive approximation register (SAR) logic circuit, but the present disclosure is not limited thereto. In practice, the circuit components exemplified herein can be replaced with other circuit components having the same or similar functions according to actual requirements.

As shown in FIG. 2, the variable current source CU1 is connected to a first terminal of the capacitor C1. A second terminal of the capacitor C1 is grounded. The comparator COM1 has a first comparison input terminal and a second comparison input terminal. The first comparison input terminal (such as an inverting input terminal) of the comparator COM1 may be connected to the first terminal of the capacitor C1. If necessary, a switch component SW1 may be connected between the first comparison input terminal of the comparator COM1 and the first terminal of the capacitor C1.

The second comparison input terminal (such a non-inverting input terminal) of the comparator COM1 may be connected to a voltage source for supplying a reference voltage Vd. The second comparison input terminal of the comparator COM1 obtains a reference voltage Vd, which is calculated by subtracting a valley voltage Valley of the voltage signal LSS of the low-side switch from a peak voltage Peak of the voltage signal HSS of the high-side switch of the power converter and represented by the following equation: Vd=Peak−Valley. An output terminal of the comparator COM1 is connected to the current modulation controller circuit CMN1. The current modulation controller circuit CMN1 is connected to the variable current source CU1.

First, the control circuit of the power converter outputs a high-side conduction signal Ton shown in FIG. 3 to the high-side switch of the power converter to turn on the high-side switch during a high-side conduction time (that is a working period) of the high-side conduction signal Ton.

The variable current source CU1 supplies a first current signal having an initial current to the capacitor C1 to charge the capacitor C1 such that a voltage Vramp1 of the capacitor C1 gradually increases, during the high-side conduction time (that is the working period) of the high-side conduction signal Ton shown in FIG. 3.

The switch component SW1 is turned on to allow the first comparison input terminal (such as the inverting input terminal) of the comparator COM1 to sample the voltage Vramp1 of the capacitor C1 at a time point of a falling edge of a waveform of the high-side conduction signal Ton. After the voltage Vramp1 of the capacitor C1 is sampled, the switch component SW1 can be turned off immediately. The switch component SW1 may be turned on again to allow the first comparison input terminal of the comparator COM1 to sample the voltage Vramp1 again at a time point of a falling edge of a next waveform of the high-side conduction signal Ton.

When the first comparison input terminal (such as the inverting input terminal) of the comparator COM1 samples the voltage Vramp1 of the capacitor C1, a voltage Vsample1 of the first comparison input terminal of the comparator COM1 is equal to the voltage Vramp1 of the capacitor C1. The comparator COM1 compares the voltage Vsample1 with the reference voltage Vd to generate a comparison signal. The reference voltage Vd is calculated by subtracting the valley voltage Valley from the peak voltage Peak. Then, the current modulation controller circuit CMN1 receives the comparison signal from the comparator COM1 and adjusts a current of the first current signal to be supplied to the capacitor C1 from the variable current source CU1 according to the comparison signal.

As shown in FIG. 3, the voltage Vramp1 sampled at a time point of a falling edge of a first waveform of the high-side conduction signal Ton is higher than the reference voltage Vd. The reference voltage Vd is calculated by subtracting the valley voltage Valley from the peak voltage Peak. Under this condition, the current modulation controller circuit CMN1 shown in FIG. 2 may control the variable current source CU1 to decrease the current of the first current signal to be supplied according to the comparison signal at a low level. When the voltage Vramp1 sampled at a time point of a falling edge of a third waveform of the high-side conduction signal Ton is equal to the reference voltage Vd, the current modulation controller circuit CMN1 stops decreasing the current of the first current signal according to the comparison signal.

Figure 5:
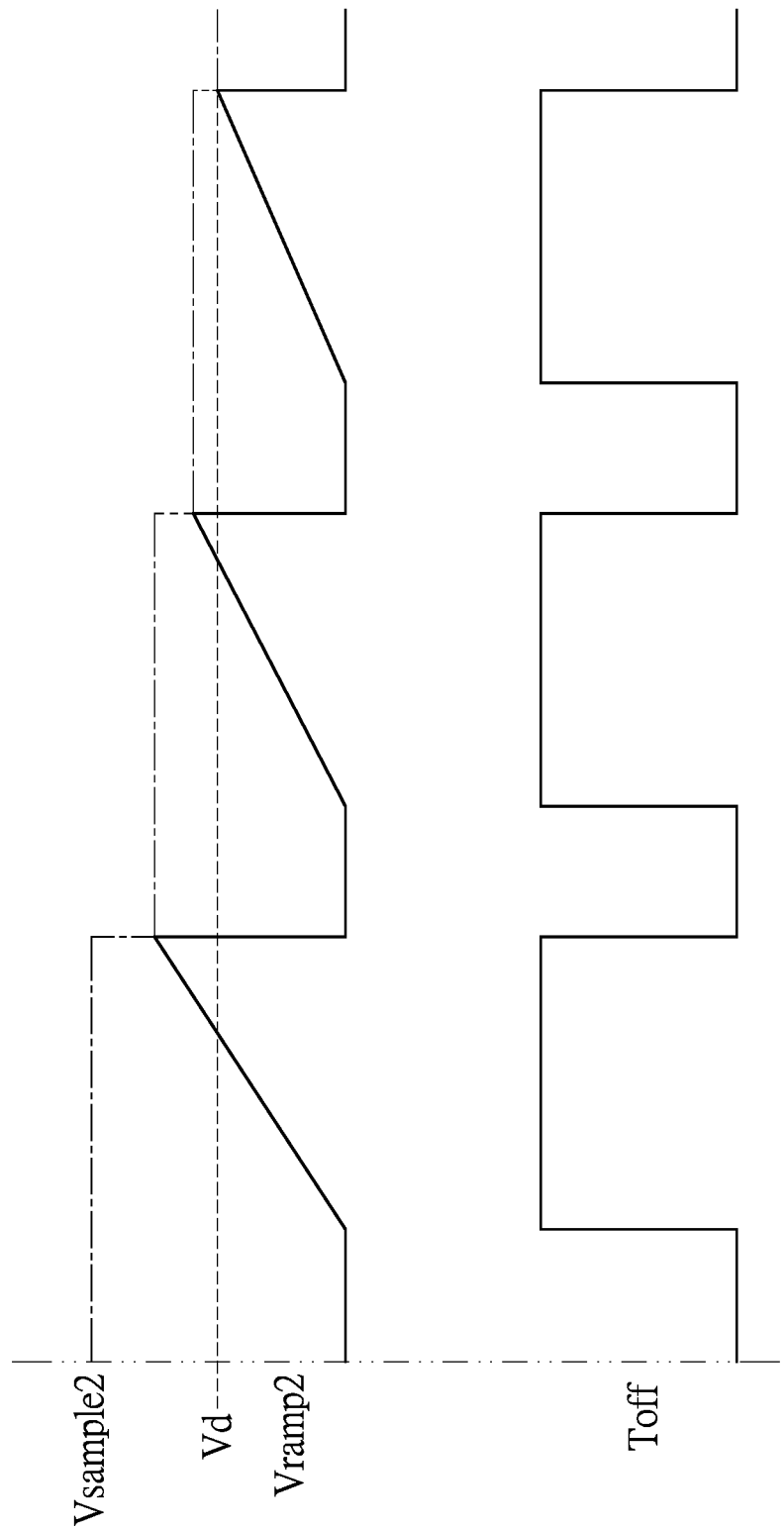
FIG. 5 is a waveform diagram of signals of the second charging current circuit of the inductor current detecting circuit according to the embodiment of the present disclosure.

Reference is made to FIGS. 4 and 5, wherein FIG. 4 is a circuit diagram of a second charging current circuit of the inductor current detecting circuit according to the embodiment of the present disclosure, and FIG. 5 is a waveform diagram of signals of the second charging current circuit of the inductor current detecting circuit according to the embodiment of the present disclosure.

In the embodiment, the inductor current detecting circuit may include the second charging current circuit shown in FIG. 4. The second charging current circuit may include a storage circuit such as a capacitor C2 shown in FIG. 4, a current supplying circuit such as a variable current source CU2 shown in FIG. 4, a voltage comparator circuit such as a comparator COM2 shown in FIG. 4, an operational amplifier or an error amplifier, and a current modulation controller circuit CMN2 shown in FIG. 4 such as a successive approximation register (SAR), but the present disclosure is not limited thereto. In practice, the circuit components exemplified herein can be replaced with other circuit components having the same or similar functions according to actual requirements.

For convenience of explanation, the inductor current detecting circuit of the embodiment includes the first charging current circuit shown in FIG. 2 and the second charging current circuit shown in FIG. 4. The first charging current circuit detects the current of the first current signal that charges the voltage Vramp1 of the capacitor C1 to be equal to the reference voltage Vd from zero during the high-side conduction time. The reference voltage Vd is calculated by subtracting the valley voltage Valley from the peak voltage Peak. The second charging current circuit detects a current of a second current signal that charges a voltage Vramp2 of the capacitor C2 to be equal to the reference voltage Vd from zero during a low-side conduction time.

A circuit architecture of the second charging current circuit shown in FIG. 4 is the same as that of the first charging current circuit shown in FIG. 2. In practice, the circuit architecture of the inductor current detecting circuit may be adjusted. For example, the inductor current detecting circuit only includes one inductor current detecting circuit, which is used to detect the first current signal and the second current signal. After the inductor current detecting circuit detects the first current signal, a voltage of a capacitor is discharged to zero and then the inductor current detecting circuit detects the second current signal.

In the embodiment, as shown in FIG. 4, the variable current source CU2 is connected to a first terminal of the capacitor C2. A second terminal of the capacitor C2 is grounded. The comparator COM2 has a first comparison input terminal and a second comparison input terminal. The first comparison input terminal (such as an inverting input terminal) of the comparator COM2 may be connected to the first terminal of the capacitor C2. If necessary, a switch component SW2 may be connected between the first comparison input terminal of the comparator COM2 and the first terminal of the capacitor C2.

The second comparison input terminal (such a non-inverting input terminal) of the comparator COM2 may be connected to a voltage source for supplying the reference voltage Vd. The second comparison input terminal of the comparator COM2 obtains a reference voltage Vd, which is calculated by subtracting the valley voltage Valley of the voltage signal LSS of the low-side switch from the peak voltage Peak of the voltage signal HSS of the high-side switch of the power converter. An output terminal of the comparator COM2 is connected to the current modulation controller circuit CMN2. The current modulation controller circuit CMN2 is connected to the variable current source CU2.

First, the control circuit of the power converter outputs a low-side conduction signal Toff shown in FIG. 5 to the low-side switch of the power converter to turn on the low-side switch during the low-side conduction time (that is a working period) of the low-side conduction signal Toff.

The variable current source CU2 supplies the second current signal having an initial current to the capacitor C2 to charge the capacitor C2 during the low-side conduction time (that is the working period) of the low-side conduction signal Toff shown in FIG. 5.

The switch component SW2 is turned on to allow the first comparison input terminal (such as the inverting input terminal) of the comparator COM2 to sample the voltage Vramp2 of the capacitor C2 at a time point of a falling edge of a waveform of the low-side conduction signal Toff. After the voltage Vramp2 of the capacitor C2 is sampled, the switch component SW2 can be turned off immediately. The switch component SW2 is turned on again to allow the first comparison input terminal of the comparator COM2 to sample the voltage Vramp2 again at a time point of a falling edge of a next waveform of the low-side conduction signal Toff.

After the first comparison input terminal of the comparator COM1 samples the voltage Vramp2 of the capacitor C2, a voltage Vsample2 of the first comparison input terminal of the comparator COM2 is equal to the voltage Vramp2 of the capacitor C2. The comparator COM2 compares the voltage Vsample2 with the reference voltage Vd to generate a comparison signal. As described above, the reference voltage Vd is calculated by subtracting the valley voltage Valley of the voltage signal LSS of the low-side switch from the peak voltage Peak of the voltage signal HSS of the high-side switch. Then, the current modulation controller circuit CMN2 receives the comparison signal from the comparator COM2 and adjusts the current of the second current signal to be supplied to the capacitor C2 from the variable current source CU2 according to the comparison signal.

As shown in FIG. 5, the voltage Vramp2 sampled at a time point of a falling edge of a first waveform of the low-side conduction signal Toff is higher than the reference voltage Vd. The reference voltage Vd is calculated by subtracting the valley voltage Valley from the peak voltage Peak. Under this condition, the current modulation controller circuit CMN2 may control the variable current source CU1 to decrease the current of the second current signal to be supplied according to the comparison signal at a low level. When the voltage Vramp2 sampled at a time point of a falling edge of a third waveform of the low-side conduction signal Toff is equal to the reference voltage Vd, the current modulation controller circuit CMN2 stops decreasing the current of the second current signal according to the comparison signal.

Figure 7:
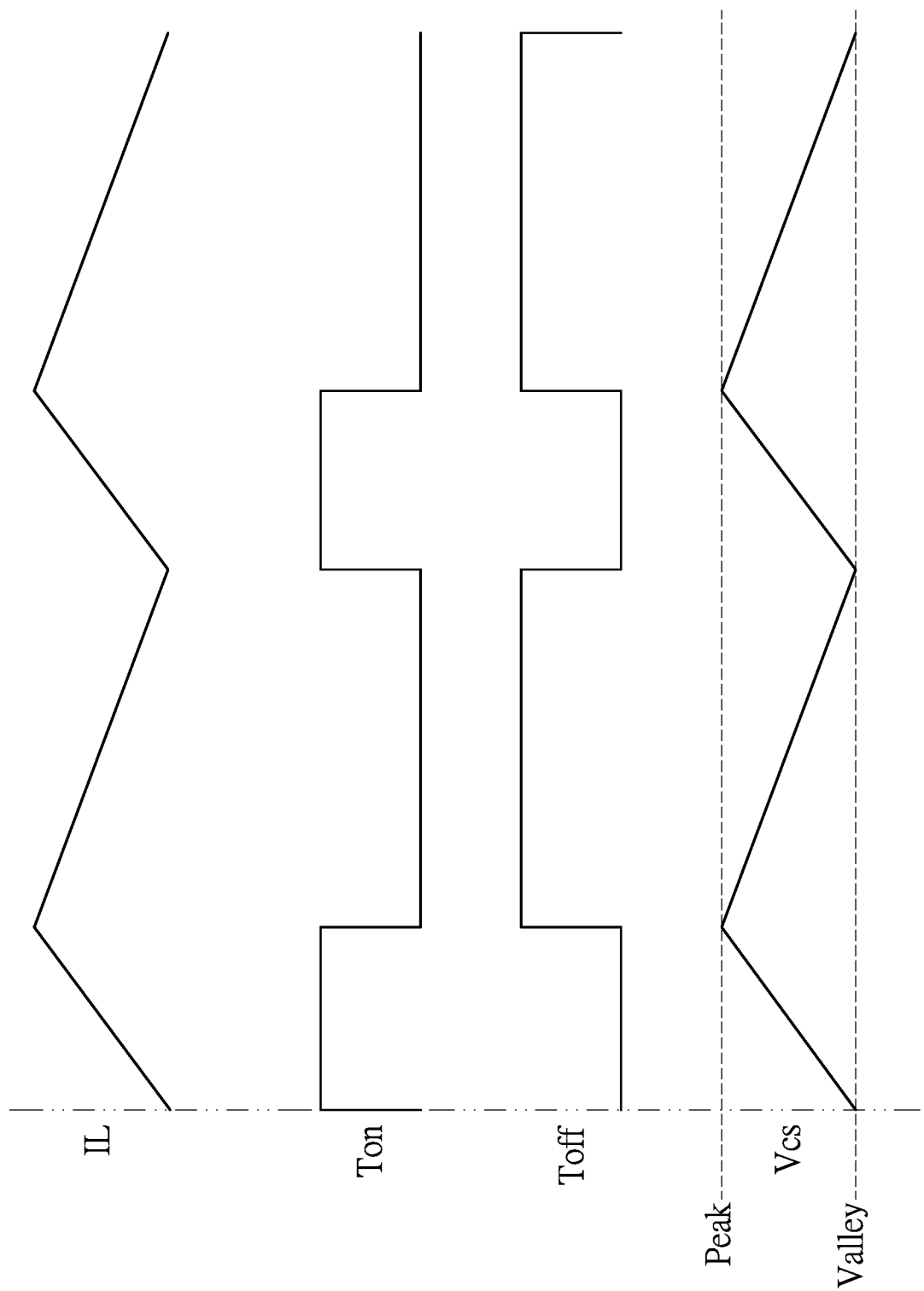
FIG. 7 is a waveform diagram of signals of the synthesizing circuit of the inductor current detecting circuit according to the embodiment of the present disclosure.

Reference is made to FIGS. 1 to 7, wherein FIG. 6 is a circuit diagram of a synthesizing circuit of the inductor current detecting circuit according to the embodiment of the present disclosure, and FIG. 7 is a waveform diagram of signals of the synthesizing circuit of the inductor current detecting circuit according to the embodiment of the present disclosure.

In the embodiment, the inductor current detecting circuit may include the synthesizing circuit shown in FIG. 6. As shown in FIG. 6, the synthesizing circuit may include a capacitor Cs, a first current source CHS, a first switch component SW31, a second switch component SW32, and a second current source CLS.

The first current source CHS may be connected to or use the variable current source CU1 shown in FIG. 2 to obtain a current value of the first current signal from the variable current source CU1. A first terminal of the first switch component SW31 is connected to the first current source CHS. A second terminal of the first switch component SW31 is connected to a first terminal of the capacitor Cs. A first terminal of the second switch component SW32 is connected to the second terminal of the first switch component SW31. The second current source CLS may be connected to or use the variable current source CU2 shown in FIG. 4. The second current source CLS is connected to a second terminal of the second switch component SW32 and a second terminal of the capacitor Cs. The second terminal of the capacitor Cs is grounded.

First, the first current source CHS supplies a high-side charging current signal. A current of the high-side charging current signal is equal to the current of the first current signal that charges the voltage Vramp1 of the capacitor C1 to be equal to the reference voltage Vd from zero as shown in FIG. 2. The reference voltage Vd is calculated by subtracting the valley voltage Valley from the peak voltage Peak.

When the first current source CHS supplies the high-side charging current signal, the first switch component SW31 is turned on and the second switch component SW32 is turned off. Under this condition, the high-side charging current is allowed to flow to the capacitor Cs through the first switch component SW31 from the first current source CHS. The capacitor Cs is charged by the high-side charging current. As a result, as shown in FIG. 7, a rising/charging waveform segment of a continuous detection voltage signal Vcs of the capacitor Cs is generated during the high-side conduction time (that is the working period) of the high-side conduction signal Ton.

The second current source CLS supplies a low-side charging current signal. A current of the low-side charging current signal is equal to the current of the second current signal that charges the voltage Vramp2 of the capacitor C2 to be equal to the reference voltage Vd from zero. The reference voltage Vd is calculated by subtracting the valley voltage Valley from the peak voltage Peak.

When the second current source CLS supplies the low-side charging current signal, the second switch component SW32 is turned on and the first switch component SW31 is turned off Under this condition, the low-side charging current is allowed to flow through the capacitor Cs and the second switch component SW32 from the second current source CLS, during the low-side conduction time (that is the working period) of the low-side conduction signal Toff. As a result, the capacitor Cs is charged by the low-side charging current such that a falling/discharging waveform segment of the continuous detection voltage signal Vcs of the capacitor Cs is generated as shown in FIG. 7.

As described above, the charging and discharging of the capacitor Cs are continuously detected to obtain a complete waveform of the continuous detection voltage signal Vcs to be converted into a continuous inductor current signal. That is, the synthesizing circuit can synthesize the high-side charging current signal and the low-side charging current signal into the continuous inductor current signal.

In summary, the present disclosure provides the inductor current detecting circuit for the power converter, in which an additional component such as a resistor that causes unnecessary power consumption is not disposed. The inductor current detecting circuit of the present disclosure can detect the complete waveform of the inductor current signal of the power converter. When the power converter such as a buck converter is operated in a current controlling mode, the high-side switch and the low-side switch are controlled according to the complete waveform of the detected inductor current signal. Therefore, the power converter can achieve the fast response effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An inductor current detecting circuit for a power converter, wherein the power converter includes an output inductor, an output capacitor, a high-side switch, a low-side switch, a comparator, a control circuit and a voltage divider circuit, one terminal of the output inductor is connected to a node between the high-side switch and the low-side switch, the other terminal of the output inductor is grounded through the output capacitor, the voltage divider circuit is connected to an output node between the output inductor and the output capacitor and divides an output voltage of the output node to output a feedback voltage, the comparator compares the feedback voltage with a reference voltage to output a voltage comparison signal, the control circuit turns on or off the high-side switch and the low-side switch according to the voltage comparison signal, and the inductor current detecting circuit comprises:
    a charging current circuit, including:
        an energy storage circuit;
        a current supplying circuit connected to the energy storage circuit, and configured to supply a first current signal to the energy storage circuit during a high-side conduction time and supply a second current signal to the energy storage circuit during a low-side conduction time;
        a voltage comparator circuit connected to the energy storage circuit, and configured to obtain a reference voltage calculated by subtracting a valley voltage of the low-side switch from a peak voltage of the high-side switch and output a comparison signal according to a voltage of the energy storage circuit and the reference voltage; and
        a current modulation controller circuit connected to the voltage comparator circuit and the current supplying circuit, and configured to modulate currents of the first current signal and the second current signal to be supplied by the current supplying circuit according to the comparison signal; and
    a synthesizing circuit connected to the current supplying circuit, and configured to synthesize the first current signal with the second current signal to obtain an inductor current signal, wherein each of the first current signal and the second current signal charges the voltage of the energy storage circuit to be equal to the reference voltage from zero.

2. The inductor current detecting circuit of claim 1, wherein the current supplying circuit includes a current source.

3. The inductor current detecting circuit of claim 1, wherein the voltage comparator circuit includes a comparator, an operational amplifier or an error amplifier.

4. The inductor current detecting circuit of claim 1, wherein the energy storage circuit includes a capacitor, a first terminal of the capacitor is connected to the voltage comparator circuit, and a second terminal of the capacitor is grounded.

5. The inductor current detecting circuit of claim 1, further comprising:
   a switch component connected between the energy storage circuit and the voltage comparator circuit, and the voltage comparator circuit is configured to sample the voltage of the energy storage circuit when the switch component is turned on.

6. The inductor current detecting circuit of claim 5, wherein the control circuit turns on the high-side switch during a working period of a high-side conduction signal, and the switch component is turned on at a time point of a falling edge of a waveform of the high-side conduction signal.

7. The inductor current detecting circuit of claim 5, wherein the control circuit turns on the low-side switch during a working period of a low-side conduction signal, and the switch component is turned on at a time point of a falling edge of a waveform of the low-side conduction signal.

8. The inductor current detecting circuit of claim 1, wherein the inductor current detecting circuit includes two charging current circuits, one of the charging current circuits is configured to supply and modulate the first current signal, and the other of the charging current circuits is configured to supply and modulate the second current signal.

9. The inductor current detecting circuit of claim 1, wherein the synthesizing circuit includes:
   a capacitor;
   a first current source connected to the current supplying circuit and configured to supply a high-side charging current signal, wherein a current of the high-side charging current signal is equal to the current of the first current signal that charges the voltage of the energy storage circuit to be equal to the reference voltage from zero;
   a first switch component, wherein a first terminal of the first switch component is connected to the first current source, a second terminal of the first switch component is connected to a first terminal of the capacitor, and a second terminal of the capacitor is grounded;
   a second switch component, wherein a first terminal of the second switch component is connected to the second terminal of the first switch component; and
   a second current source connected to the current supplying circuit, a second terminal of the second switch component and the second terminal of the capacitor, and configured to supply a low-side charging current signal, wherein a current of the low-side charging current signal is equal to the current of the second current signal that charges the voltage of the storage circuit to be equal to the reference voltage from zero;
   wherein when the first switch component is turned on and the second switch component is turned off, the high-side charging current signal flows to the capacitor such that the capacitor generates a charging current signal;
   wherein when the second switch component is turned on and the first switch component is turned off, the low-side charging current signal flows to the capacitor such that the capacitor generates a discharging current signal, which is synthesized with the charging current signal to form an inductor current signal.

10. The inductor current detecting circuit of claim 1, wherein the current modulation controller circuit includes a continuous progressive logic circuit.

\* \* \* \* \*